United States Patent [19]

McElroy

[11] Patent Number: 4,491,857

[45] Date of Patent: Jan. 1, 1985

[54] AVALANCHE FUSE ELEMENT WITH ISOLATED EMITTER

[75] Inventor: David J. McElroy, Houston, Tex.

[73] Assignee: Texas Instruments Incorporated, Dallas, Tex.

[21] Appl. No.: 361,011

[22] Filed: Mar. 23, 1982

[51] Int. Cl.³ .................. H01L 29/70; H01L 29/86; H01L 29/78

[52] U.S. Cl. ........................... 357/23; 357/35; 357/51; 357/53

[58] Field of Search ............... 357/35, 23 R, 51, 53; 365/96, 103, 104

[56] References Cited

U.S. PATENT DOCUMENTS 4,350,992 9/1982 Tubbs .................. 365/104 X
4,399,523 8/1983 Gerber et al. ........... 365/103 X

OTHER PUBLICATIONS

"Electrically Alterable Avalanche-Injection-Type, MOS Read Only Memory, with Stacked Gate Structure"—Iizuka et al.,—IEEE Transactions on Electron Devices—vol. ED-23-4-1976—pp. 379-387.

1024-Bit MNOS RAM Using Avalanche Tunnel Injection, Uchida et al.—IEE Journal of Solid State Circuits—vol. SC10 No. 5, pp. 288-293, Oct. 1975.

Primary Examiner—Andrew J. James
Assistant Examiner—Sheila V. Clark
Attorney, Agent, or Firm—John G. Graham

[57] ABSTRACT

A programmable device is provided by a thin-oxide avalanche fuse element which is programmed at a voltage below the oxide breakdown level. This device may be used to fix the addresses of faulty rows or columns in a memory having redundant or substitute cells. Upon breakdown, the thin oxide is perforated by small holes which fill with silicon to create short circuits. The source or emitter of the transistor device may be separated from the drain and gate by thick field oxide.

7 Claims, 17 Drawing Figures

Fig. 7
BONDING PAD TO EXTERNAL HIGH VOLTAGE FOR PROGRAMMING

AVALANCHE FUSE ELEMENT WITH ISOLATED EMITTER

Related Cases

This application contains subject matter also disclosed in my copending application S.N. 361,008 and 361,009. Filed herewith and assigned to Texas Instruments.

BACKGROUND OF THE INVENTION

This invention relates to semiconductor memory devices and more particularly to a programmable read-only memory and method of making.

Read-only memory (ROM) devices are commonly used for program storage in microcomputer systems or the like. These ROMs have been mask-programmed as in my U.S. Pat. Nos. 4,208,726 or 4,219,836, assigned to Texas Instruments, or electrically programmable (EPROMs) as in my U.S. Pat. No. 4,151,021, assigned to Texas Instruments; both such mask ROMs and EPROMs are N-channel silicon-gate MOS products. For higher speed operation bipolar programmable ROMs (PROMs) are employed; see U.S. Pat. No. 4,209,894, assigned to Texas Instruments. Electrically-erasable programmable memory devices (EEPROMs) are also availiable as in my U.S. Pat. No. 4,122,544, assigned to Texas Instruments.

Programmable memory devices of the ROM, EPROM or EEPROM types have been very widely used in large volume production measured in many millions of units; however, the continuing trends toward lower cost, shorter access time, higher programming speed, shorter production lead times higher reliability and reduced operating power have presented constraints for each class of products.

Mask ROMs are low cost in high volume production of a single ROM code, but have the disadvantage of a long lead time from the specification of the code to the delivery of finished devices; this lead time can be many weeks or even months from the equipment manufacturers' standpoint. EPROMs have the advantage of being programmable by the equipment manufacturer, so lead time is virtually zero, but these devices are costly because of the quartz window needed in the package for erasing by ultraviolet light. It has not been practical to deliver EPROMs in cheaper plastic (i.e. opaque) packages because of the problem of testing when erasure is impossible, and because of materials considerations. EEPROMs avoid the use of a quartz window in the package, but require a complex manufacturing process and larger cell size, so these devices will probably have limited use until the cost can be reduced. Bipolar PROMs are excellent for higher speed requirements, but are costly due to the semiconductor processing and cell size.

Programmable cells or devices are also used in fault-tolerant memory devices; that is, memory devices have redundancy in the form of rows or columns of cells which are substituted for certain rows or columns containing faulty cells. The memory array is tested after manufacture and the programmable cells used to fix the addresses of the bad rows or columns; in operation an incoming address to the memory is compared and substitution made if a match occurs. Previously, fusable polysilicon links or laser blown links have been the favored methods of implementing the programmable devices. Polysilicon links have the disadvantage of requiring removal of the protective coating on the chip over the fusable link so that a reliable open-circuit fuse blow is obtained. Laser blowing requires elaborate equipment and controls, and must be done before protective coating.

It is therefore the principal object of this invention to provide an improved programmable cell for a memory device and method of manufacture. Another object is to provide a PROM device or programmable cell of low cost and high speed. A further object is to provide a PROM device or programmable cell which can be made by a standard semiconductor manufacturing process.

SUMMARY OF THE INVENTION

In accordance with one embodiment of the invention, a programmable device is provided by a thin-oxide avalanche fuse element which is programmed at a voltage below the oxide breakdown level. This device may be used to fix the addresses of faulty rows or columns in a memory having redundant or substitute cells. Upon breakdown, the thin oxide is perforated by small holes which fill with silicon to create short circuits. The source or emitter of the transistor device may be separated from the drain and gate by thick field oxide.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Referring to FIGS. 1, 2 and 3a-3d, a programmable memory cell array according to one embodiment of the invention is formed on a silicon substrate 10 in which a large number of access transistors 11 are created beneath polysilicon row ("word") address lines 12, with each set of four transistors 11 sharing a program transistor 13. The program transistor 13 contains four separate breakdown edges 13a-13d, one for each memory cell defined by the four-transistor set of FIGS. 1 or 2. Each of the cells in a column is connected to a metal column or "bit" line 14 at a metal-to-silicon contact area 15. A polysilicon strip 16 forms the gate of all of the transistors 13 for two adjacent rows of cells. The silicon substrate or chip 10 usually would contain a large number of cells, such as 64K ($2^{18}$ or 65,536) cells in an array partitioned "×8" with 128 rows and 512 columns (in 8 groups of 64 columns), for example. Thus there would be 128 row lines 12, 512 column lines 14, and sixty-four strips 16 on one chip, with 65,536 of the transistors 11.

The access transistors 11 have a gate oxide layer 17 which is thicker than the gate oxide layer 18 for the program transistor 13 as seen in the section views of FIGS. 3a-3d. This difference in thickness facilitates programming at the breakdown edges 13a-13d rather than at the gate oxide 17. For example, the oxide 17 may be 600 Å and the oxide 18 only 300 Å in one embodiment. Otherwise, the memory array is manufactured by a standard N-channel self-aligned silicon-gate MOS process such as that set forth in U.S. Pat No. 4,055,444, assigned to Texas Instruments.

Source and drain regions for the transistors 11 and 13 are created by N+ implanted or diffused regions 19 in the P-type substrate 10, self-aligned with the polysilicon strips 12 or 16. A thick thermal oxide or "field" oxide coating 20 on the face of the chip 10 surrounds all of the transistors 11 and 13 and the diffused source/drain regions 19. A P+ channel stop region 21 is formed beneath all of the field oxide. A layer 22 of low-temperature deposited oxide on the face of the chip 10 insulates the metal level comprising bit lines 14 from the polysilicon conductor level comprising row lines 12 an strip 16. The deposited oxide 22 is about 10,000 Å, much thicker than gate oxide. Holes are etched in the oxide layer 22 for the metal-to-silicon contacts 15.

Figure 1:
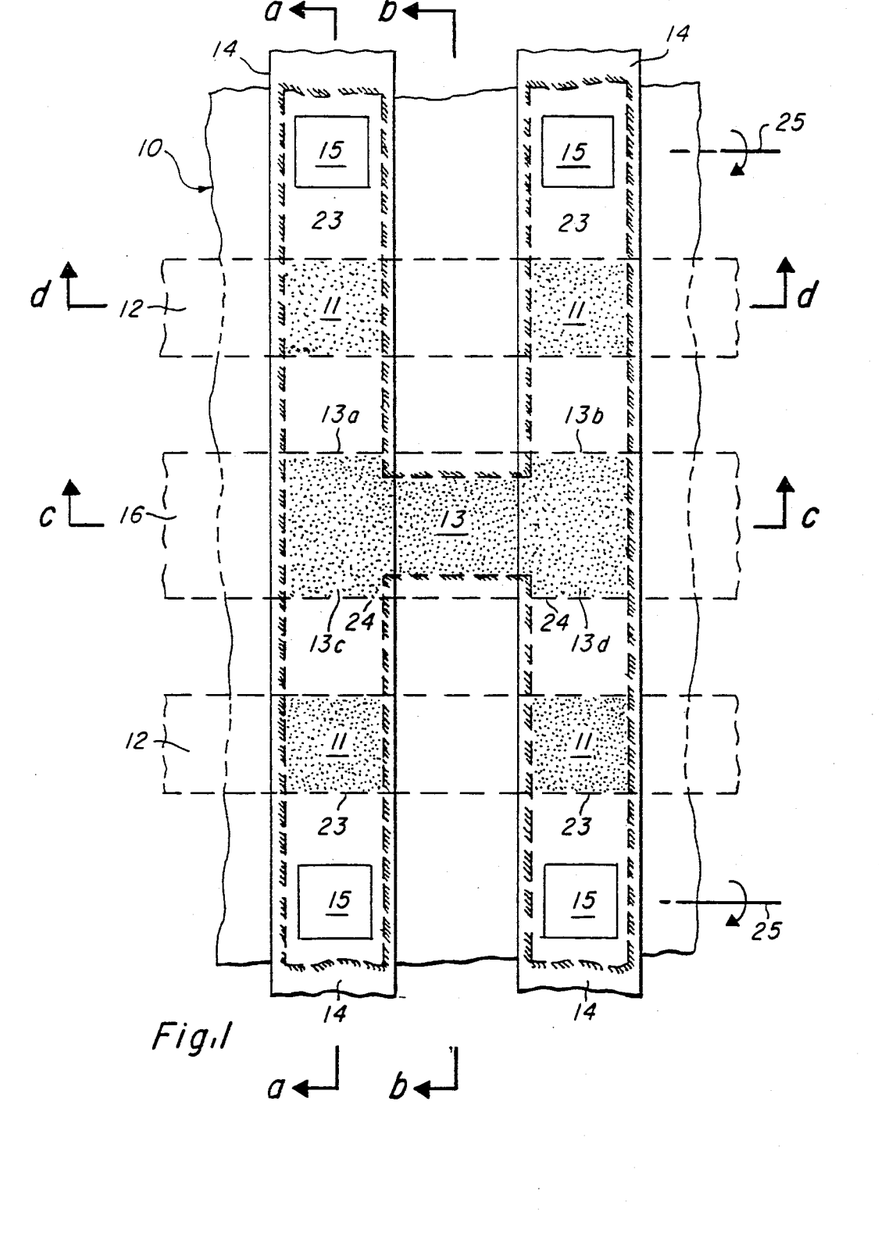
FIG. 1 is a greatly enlarged plan view of a small portion of a semiconductor chip showing the physical layout of a part of a memory cell array according to the one embodiment of the invention.

The polysilicon row lines 12 form gates 23 for all of the transistors 11, and the polysilicon strips 16 form gates 24 for the program elements 13 in the memory array. The four-transistor set of FIG. 1 is repeated in the array by mirroring the set about lines 25 so that each contact 15 is shared by two adjacent transistors 11, meaning that only ½ contact per cell is needed or 32.5K for a 65,768 device. No contact is needed for the ground side of a cell because the adjacent transistor provides a ground side during programming, while the strip 16 is ground return during read operation.

Figure 2:
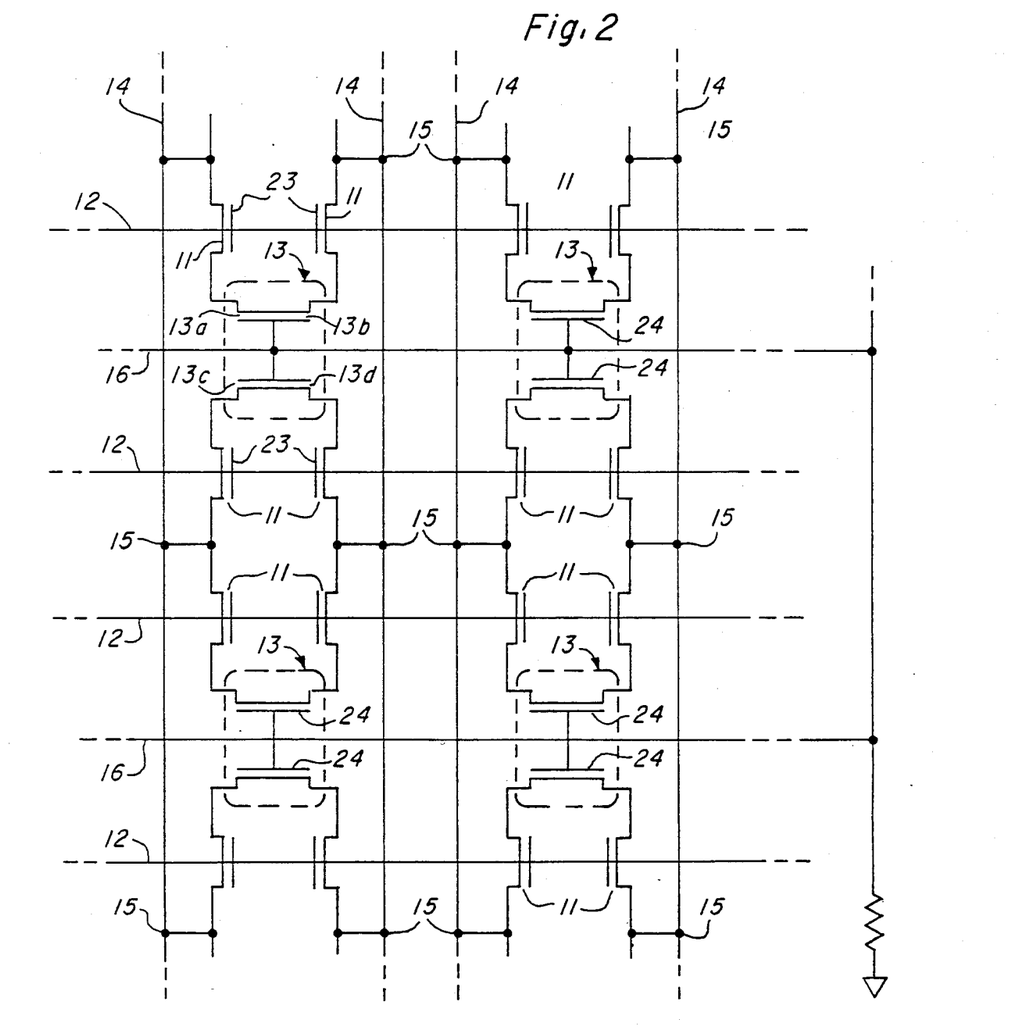
FIG. 2 is an electrical schematic diagram of the part of the cell array of FIG. 1.
Figure 3:
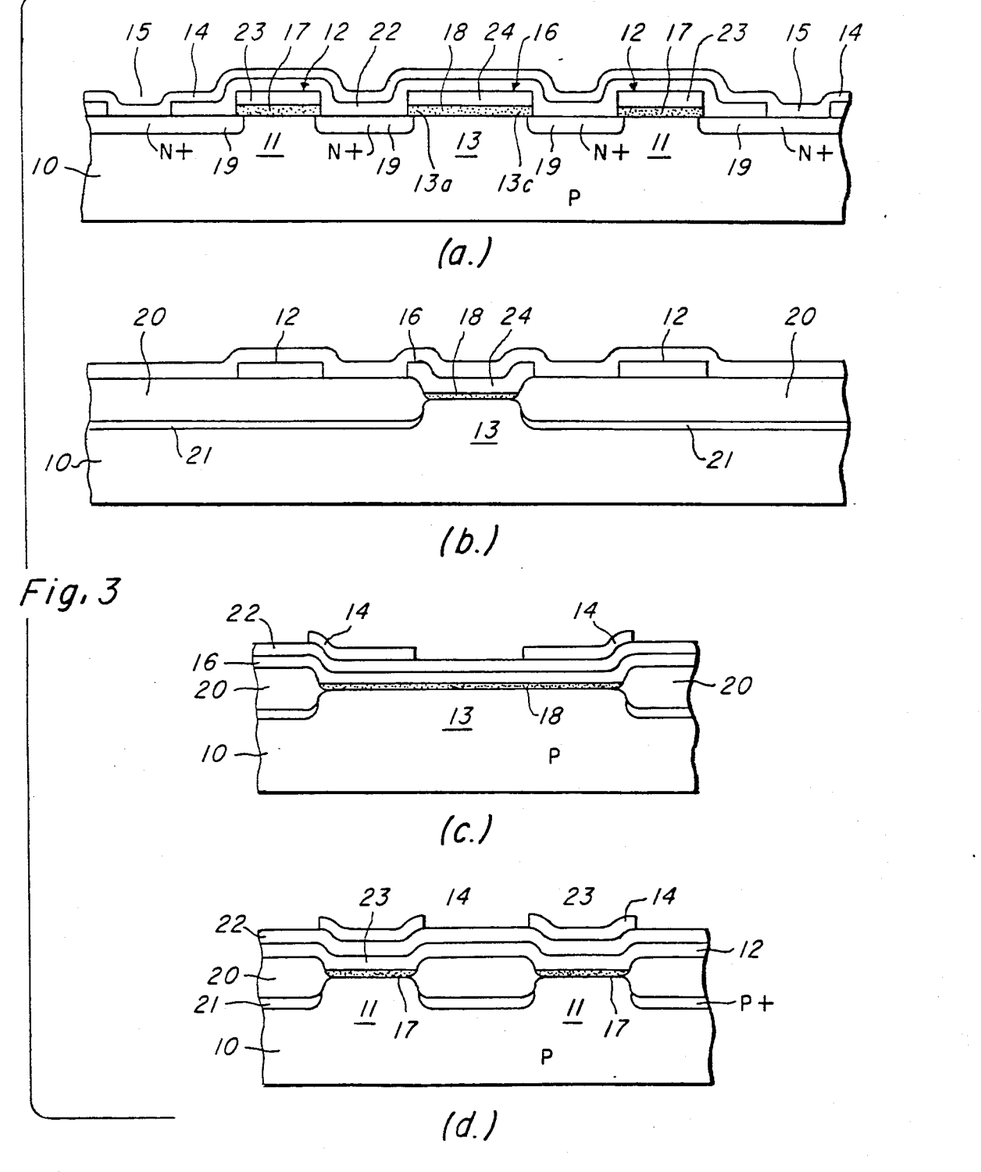
FIGS. 3a–3d are elevation views in section of the cells of FIG. 1, taken along the lines a—a through d—d, respectively, in FIG. 1.

The programming mechanism for the memory cell array thus far described is that of breaking down the thin oxide 18 at a selected one of the edges 13a, 13b, 13c or 13d to create minute holes through the oxide at this edge to be filled with silicon from the gate 24, leaving an electrical short from the N+ region 19 to the gate 24 for a selected cell. The line 16 is grounded in normal operation, so to read the information programmed into the memory array a "1" voltage (e.g. +5 V) on a selected row line 12 will turn on a row of access transistors 11, allowing the condition of one program edge 13a-13d to be sensed by a selected column line 14. Thus, if the edge 13a corresponds to the cell at the intersection of selected row line 12 and selected column line 14, the transistor 11 for this selected cell is rendered conductive via +5 V on gate 23, and if the edge 13a is shorted a "0" will be sensed while if not shorted a "1" is sensed. That is, the line 14 can be discharged toward ground line 16 if shorted, but not if the program edge 13a is open-circuited. To program the edge 13a, the row line 12 for this cell is brought to a programming voltage Vp of about +20 V, and all other row lines 12 are held at ground; the column line 14 for this cell (left-most in FIG. 2) is also brought up to Vp, while the other line 14 for this four-transistor set (second from left in FIG. 2) is held at ground and all other column lines 14 float at high impedence to ground. Under these conditions an avalanche effect occurs at the edge 13a but not at 13b or any of the other such edges. This effect inhances electron tunneling and produces current pulsing in the circuit from line 14 through transistor 11, edge 13 a, gate 24 and line 16 to ground. The line 16 is grounded through a resistance of about several Kohm for current limiting purposes. All lines 16 in the array are connected together as seen in FIG. 2. This current pulsing does not occur in any of the other program devices 13 in the array wherein the lines 12 and 14 are not at Vp; in the row with edge 13a the line 12 is high but line 14 is not (except for selected column) so there is no current through the transistors 11, while in the other cells in the same column as edge 13a the line 14 is high but the gates 23 are held low so there can be no current flow in transistors 11. The edge 13b does not program at this time because the line 14 for this cell is grounded so no current flows. The current spikes create holes in the oxide 18 at edge 13a and locally heat the polysilicon or silicon in the vicinity of the minute holes, flowing silicon into these holes to leave electrical shorts; several of these occur within about 100 microseconds, then a steady-state condition is reached in which the voltage on gate 24 rises to a level determined by the IR drop accross the resistance from line 16 to ground, serving to limit the current flow through the path including gate 24, edge 13b and the other transistor 11 to the grounded line 14. It is important to note that the programming mechanism is not that of dielectric breakdown of the oxide 18; indeed the programming voltage Vp is chosen to be about 60% of the oxide breakdown strength of about +35 V. Local heating due to reverse P-N junction avalanche breakdown, and bipolar second breakdown, is responsible for the programming, rather than dielectric breakdown. The avalanche breakdown voltage is lowered by the field-plate effect of the gate-to-drain voltage. It is important that the channel length of the transistor 13 (from edge 13a to edge 13b in this example) be long enough to prevent short-channel effects, i.e., the depletion region should not extend the length of the channel at programming voltage, and further that the channel width at the narrowest part of 13 be at least as wide as that of the transistor 11. The source (region 19) for transistor 13 should not be high impedence.

Figure 4:
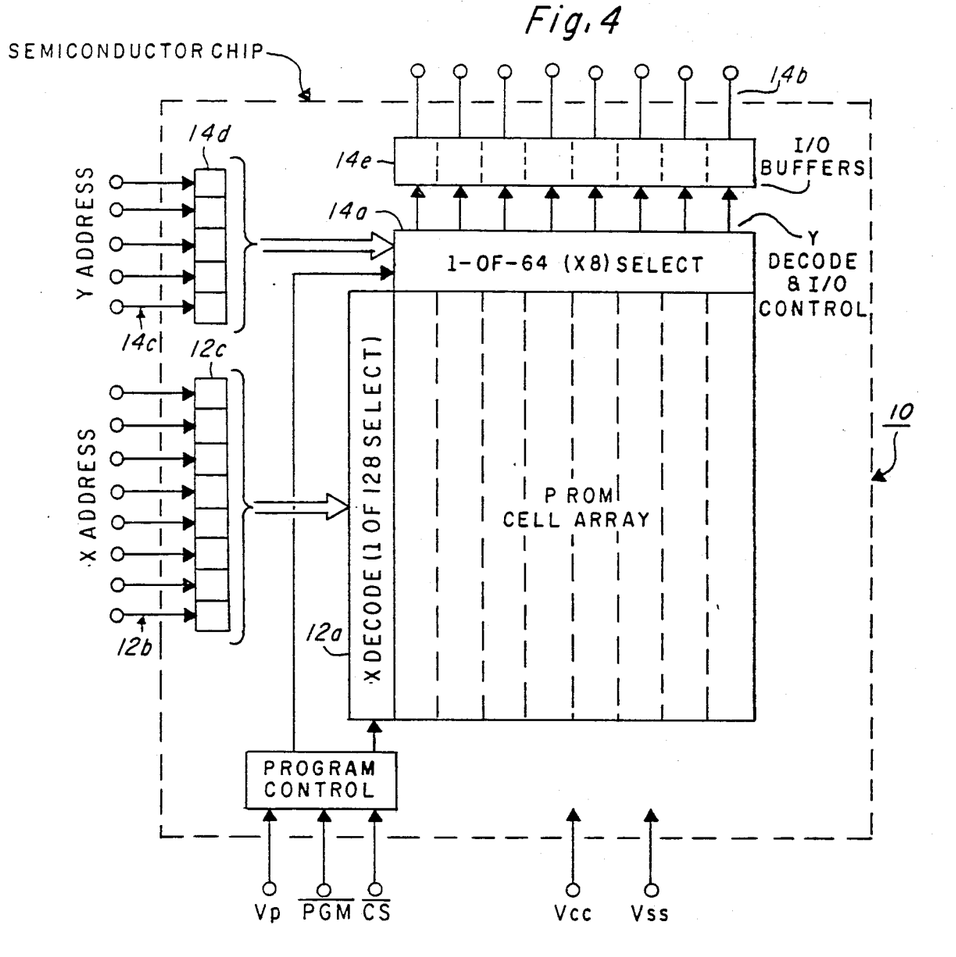
FIG. 4 is a block diagram of a memory device using a cell array of FIGS. 1 and 2 according to the invention.

Referring to FIG. 4, a memory device according to an example embodiment of the invention is an array which contains 128 rows and 512 columns of memory cells as in FIGS. 1 and 2 for a total of 65,536 cells, partitioned to provide an 8-bit or byte-wide output as is usual for microprocessor memory devices. An X decoder 12a selects one-of-128 row lines 12, dependent upon an eight-bit X address from terminals 12b and address buffers 12c. A Y decoder 14a selects eight-of-512 column lines 14 (one-of-64 in each partition) as the output on pins 14b (or input for programming the PROM cells) based on a six-bit Y address from terminals 14c via address buffers 14d. The Y address is used also to select a line 14 for grounding adjacent the selected column line 14 in program mode, and for establishing a high impedance float condition on the remaining unselected lines. Each bit of the eight-bit output from the array is connected to one of eight buffers 14e and thus to the eight data terminals 14b. The +5 V supply voltage and ground are supplied by Vcc and Vss terminals; the 5 V supply is used for read operations. To program the PROM, a high voltage Vp of about +20 V is applied to a terminal Vp, along with other controls such as PGM as may be desired, depending upon the particular circuit design chosen. A chip select input CS may also be employed as in standard practice. For programming, the high voltage Vp is applied to the selected row line 12 in the PROM cell array, and the high voltage is applied to the some of the eight selected column lines 14 and while Vss is applied to the eight adjacent ground lines 14, depending upon the Y address and the 1's and 0's of the input data byte on the terminals 14b; this programs the gate edges 13a–13d of selected PROM cells.

Figure 4A:
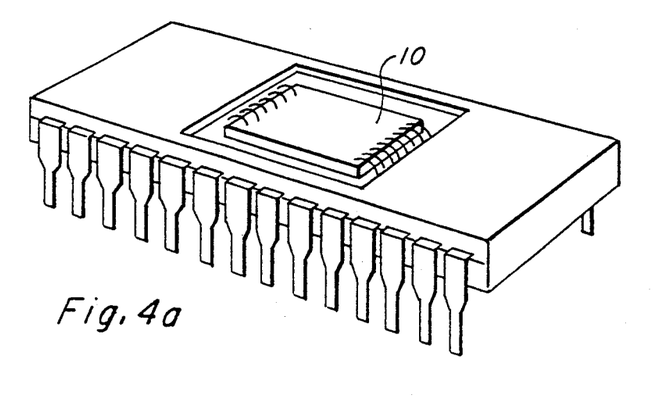
FIG. 4a is a pictorial view of a semiconductor package containing the chip 10 of FIG. 4.

The array formed on the silicon bar 10, containing 64K bits on a bar less than 200 mils on a side (depending upon the minimum line resolution which determines bit density) is mounted in a standard dual-in-line plastic package of the 28 pin type as seen in FIG. 4a. The cells shown in FIG. 1 or 3a–3d would be on a very minute part of this bar, perhaps only about one or two mils wide.

Figure 5:
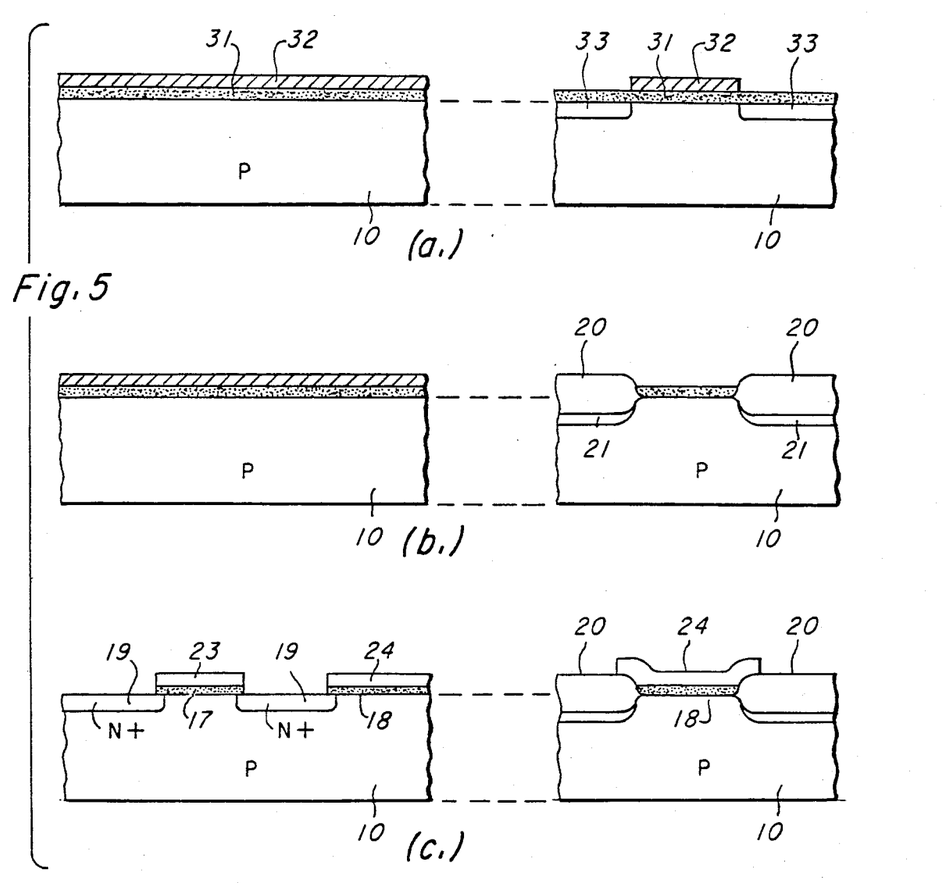
FIGS. 5a–5c are elevation views in section corresponding to FIGS. 3a and 3b at various stages in manufacture.

Turning now to FIGS. 5a–5c, a process for making the PROM according to the invention will be described. The starting material is a slice of P type monocrystalline silicon typically four inches in diameter, cut on the <100> plane, of a resistivity of about ten ohm-cm. In the Figures the portion shown of the bar 10 represents only a very small part of one bar or chip, which in turn is a very small part of the slice. One slice contains several hundred bars 10. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 20 and the P+ channel stops 21. The resist is developed, leaving areas where nitride is then removed by etching the exposed part of the nitride layer 32 but leaving in place the oxide layer 31, as seen in FIG. 5a.

Using photoresist and nitride as a mask, the slice is subjected to a boron implant step to produce the channel stop regions in unmasked regions 33 of the silicon. The regions 33 will not exist in the same form in the finished device, because silicon is consumed in the field oxidation procedure. Usually the slice is subjected to a heat treatment after implant, prior to field oxide growth, as set forth in the above-mentioned U.S. Pat. No. 4,055,444.

The next step in the process is the formation of field oxide 20 by subjecting the slices to steam or an oxidizing atmosphere at about 1000° C. for at least ten hours. This causes a thick field oxide layer 20 to be grown as seen in FIG. 5b, extending into the silicon surface as silicon is consumed, with the remaining part of the nitride layer 32 masking oxidation. The thickness of this layer 20 is about 10000 Å, part of which is above the original surface and part below. The boron doped P+ regions 33 formed by implant are partly consumed, but also diffuse further into the silicon ahead of the oxidation front to produced P+ field stop regions 21 which are must deeper than the original regions 33.

Next the remaining nitride layer 32 is removed by an etchant which attacks nitride but not silicon oxide, then the oxide 31 is removed by etching the exposed silicon cleaned. The oxide layer 17 in grown by thermal oxidation, then a photoresist operation used to remove the oxide 17 in the area of the program transistors 13 so that a thinner oxide layer 18 can be grown at this point. The oxide 17 has a thickness of about 600 Å, and oxide 18 about 300 Å.

As seen in FIG. 5c a layer of polycrystalline silicon is deposited over the entire slice in a reactor using standard techniques to a thickness of about 8000 Å. This polysilicon layer is patterned by applying a layer of photoresist, exposing to ultraviolet light through a mask prepared for this purpose, developing, then etching the exposed polysilicon to define the row lines 12 and strips 16. An arsenic implant or a phosphorus diffusion is now performed to create the N+ regions 19, using the polysilicon 12 and 16 and its underlying oxide 17 and 18 as a self-align mask.

A thin thermal oxide coating is usually grown over the polysilicon, then the thick layer 22 of silicon oxide is deposited over the entire slice by decomposition of silane at a low temperature, about 400° C. This layer 22 insulates the metal layer from the layer of polycrystalline silicon and other areas of the face of the bar, and is referred to as multilevel oxide.

Referring to FIG. 3a–3d the multilevel oxide layer 22 (and underlying thin thermal oxide) is now patterned by a photoresist operation which exposes holes for what will be the metal-to-poly contacts 15 along the bit lines 14 in the cell array. The metal bit lines 14 are formed next. Metal contacts and interconnections are also used in a periphery of the chip in the input buffers, decoders, sense amplifiers, and the like, as well as for the bonding pads which provide connection to external electrodes. These metal lines 14 and peripheral metallization are made in the usual manner by depositing a thin film of aluminum over the entire top surface of the slice then patterning it by a photoresist mask and etch sequence, leaving the metal strips 14 and other metal elements. A protective overcoat (not shown) is then deposited and patterned to expose the bonding pads, and the slice is scribed and broken into individual bars which are packaged in the customary manner, FIG. 4a.

Figure 6:
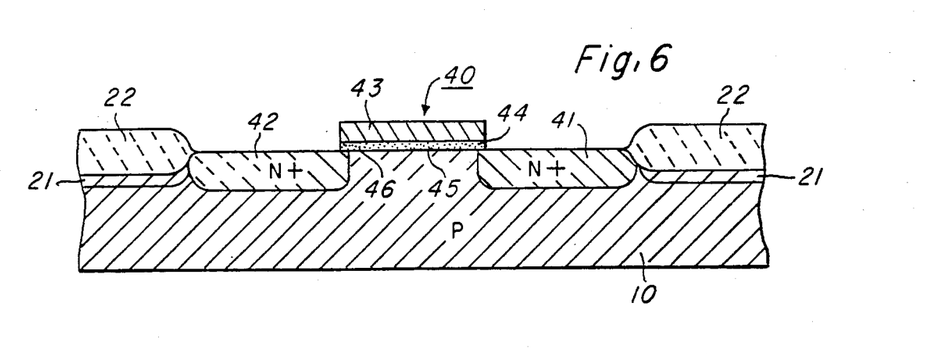
FIG. 6 is an elevation view in section of a programmable device according to another embodiment of the invention.
Figure 7:
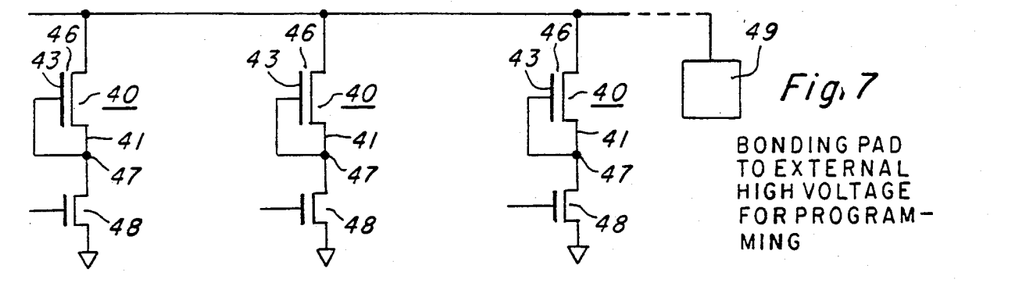
FIG. 7 is an electrical schematic diagram of a circuit using the device of FIG. 6.
Figure 8:
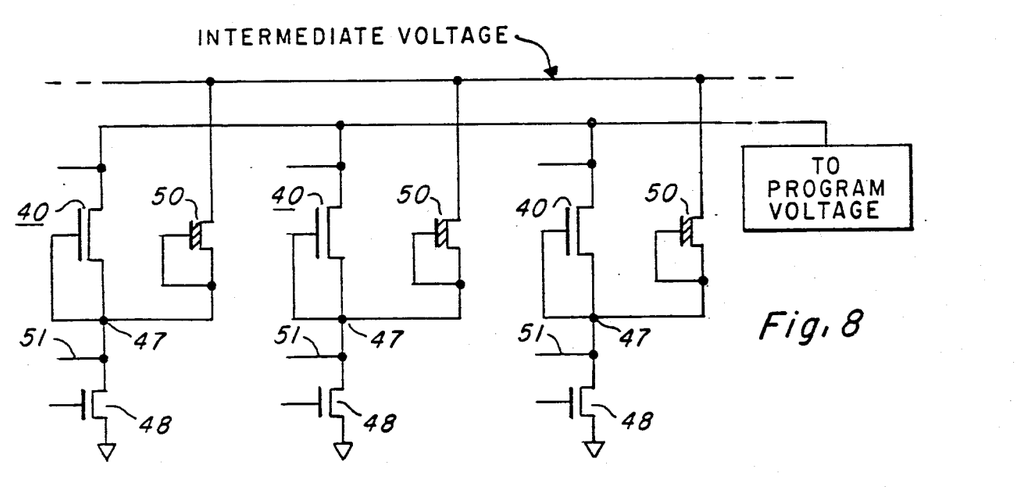
FIG. 8 is an electrical schematic diagram as in FIG. 7 according to another embodiment.

The concept of the invention when used for programmation of redundant devices, or other options on a semiconductor chip, is embodied in a simpler form as shown in FIGS. 6–8. The programmable transistor-like device 40 includes a source 41, a drain 42 and a gate 43, with thin oxide 44 (corresponding to oxide 18 of FIG. 3a). Connections are made to the electrodes as in FIG. 7, using techniques of FIGS. 1 and 2–5c. This structure of FIG. 6 can be used as a fuse. For example, if the source 41 and gate 43 are grounded, and the drain 42 brought to avalanche voltage, the drain 42 will short to the gate 43 at the edge 46 (just as the edge 13a, etc., above). On the other hand, if the source 41 and gate 43 are floating and the drain 42 is brought to avalanche voltage, the damage at the edge 46 will not occur. Therefore, by shunting the node 47 (source 41 and gate 43) to ground by a low-impedance transistor 48 as seen in FIG. 7, the appropriate fuse 40 is selected for programming, using only a single bonding pad 49 on the chip going to an external high voltage supply. It may be also advantageous to force the node 47 to a slightly positive voltage, intermediate between ground and the avalanche breakdown voltage, using transistors 50 as seen in FIG. 8; this will assure that only a selected device 40 will draw avalanche current. After programming, the devices 40 in the circuits of FIGS. 7 and 8 are used by grounding all drains 42 via line 51 and turning off all transistors 48, then sensing the condition at nodes 47 by static or dynamic means; for example, in a redunant memory, the address of a row to be substituted may be programmed into a set of the cells 40, then an incoming address compared with the programmed address detected at the nodes 47.

Figure 9:
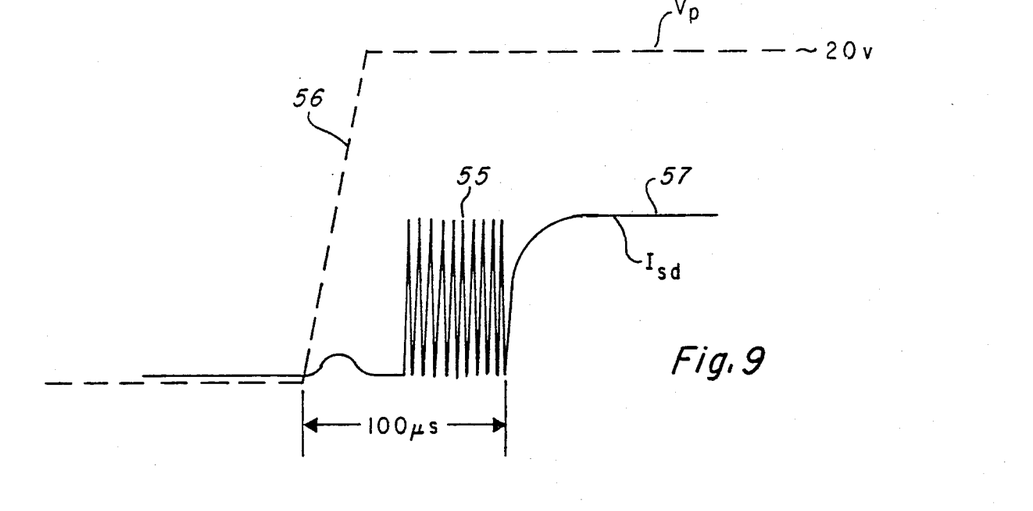
FIG. 9 is a timing diagram of voltage or current vs. time in programming the devices of FIGS. 1 or 6.

Referring to FIG. 9, the programming mechanism wherein the oxide 18 or 46 breaks down in the devices of FIGS. 1, 3a or 6 produces a characteristic current waveform containing oscillations or spikes 55. When the source and gate have the voltage indicated by dotted line 56 applied thereto, the current through the source-to-drain path is according to the solid line including spikes 55; after about 100 microsec, the current settles at a steady state level 57 and the device is permanently programmed.

Figure 10:
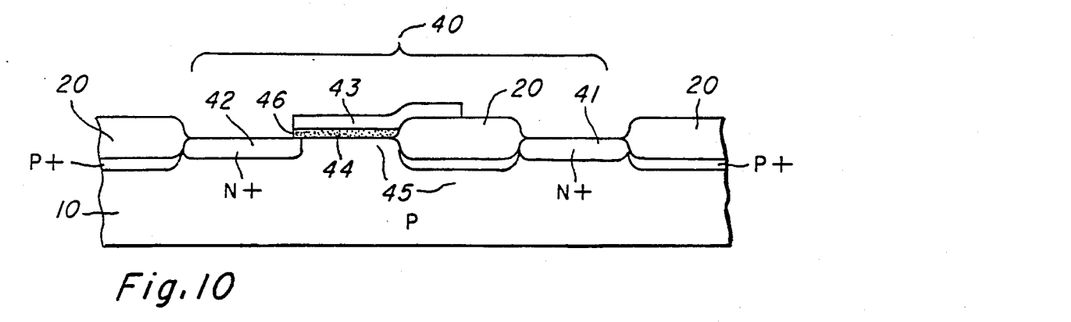
FIG. 10 is an elevation view in section of a programmable element as in FIGS. 6 or 3a, according to another embodiment.

With reference now to FIG. 10, an embodiment of the invention is shown wherein the source-to-drain path is not continuous across the face of the bar 10, but instead the field oxide 20 extends between the source 41 and drain 42 for a device 40. The gate 43 extends up onto the field oxide 20. The channel 45 or path for carriers between source and drain includes the bulk P-type material of the bar 10. That is, it is not necessary for thin oxide 44 to bridge the source-to-drain path, nor is it necessary for the gate 43 to extend all the way to the source 41. The function of the gate 43 is to establish a field-plate breakdown region 46; the reverse p-n junction breakdown voltage of the drain-to-channel N-to-P junction goes down from about 35 v. to about 20 v. due to the field plate created by gate 43 when the gate-to-drain voltage is high. The source acts only as a bipolar emitter which is forward biased when the local substrate 10 voltage goes positive as a result of avalanche hole current.

Figure 11:
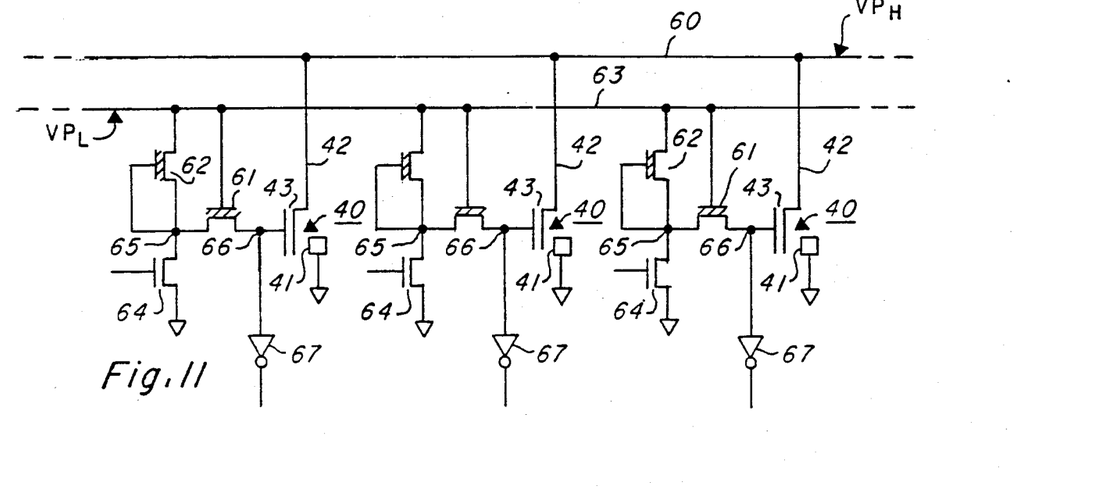
FIG. 11 is an electrical schematic diagram of a circuit using the device of FIG. 10.

Since no path exists for traditional MOS field-effect transistor current in the device of FIG. 10 when the gate 43 is at logic 1, the addressing and programming is much simpler for this isolated emitter (i.e., source) embodiment. In FIG. 11, a circuit is shown which makes use of this feature. The fuse devices 40 have the drains 42 connected to a $VP_H$ line 60 which is connected to a bonding pad for coupling to an off-chip supply of about +26 V. The gates 43 are all connected through transistors 61 and 62 to a line 63 having a lower programming voltage $VP_L$, about +15 v, thereon. A select transistor 64 connects each of the nodes 65 to ground if the device is to be shorted, (programmed) or leaves the node 65 high if avalanche conditions are not to be produced. For read, the line 60 is held at logic 1 (+5 V), and line 63 is at 0; the nodes 66 are sensed by amplifiers 67. If a device 40 has been shorted, the voltage on node 66 is high; if a device is still open-circuited, the node 66 is low. No select transistor 48 in series with the fuse devices 40 needed as was true in FIG. 7 or FIG. 8.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A programmable semiconductor device comprising:
   transistor means having a source, a drain, and a source-to-drain path at a face of a semiconductor body, said source-to-drain path extending in said face from said source to said drain, and a gate overlying said face between said source and said drain, said source functioning as an emitter of minority carriers,
   a thin dielectric separating the drain from the gate at an interface between said drain and said source-to-drain path,
   a thick field oxide area between the source and drain on said face above said source-to-drain path, and
   means for applying a high voltage to the drain and a low voltage to the source and gate, said high voltage selectively breaking down the dielectric to create an electrical short between said drain and said gate, said short being created by avalanche breakdown of the junction at the drain and by minority carrier second breakdown, the value of said high voltage needed for breaking down the dielectric being reduced by field-plate effect to less than the dielectric-breakdown voltage of the thin dielectric.

2. A device according to claim 1 wherein the transistor means will not function as an insulated-gate field-effect transistor due to said thick field oxide.

3. A device according to claim 1 wherein said electrical short is in the form of a plurality of minute holes in said dielectric, said holes being filled with melted and resolidified silicon.

4. A device according to claim 1 wherein said high voltage produces a sequence of current spikes through said dielectric.

5. An avalanche-mode fuse element comprising:
   filed-effect type transistor means including a source region and a drain region in a face of a semiconductor body and a gate overlying the face between the source and drain regions, said gate being adjacent the drain but spaced laterally along the face from the source region,
   a thin-oxide break-down area between the gate and the face adjacent the drain region,
   and means for applying a high voltage to the drain and a low voltage to the source and gate to break down an area of the thin oxide adjacent the drain to create an electrical short using avalanche mode and bipolar second breakdown,
   wherein the value of said breakdown voltage across said area is reduced to less than the dielectric breakdown voltage thereof by field-plate effect.

6. A fuse element according to claim 5 wherein said dielectric breakdown voltage is in excess of 30 v. and the voltage creating said electrical short is less than about 25 v.

7. A fuse element according to claim 5 wherein an area of thick field oxide is interposed on said face between the source and drain regions.

* * * * *